United States Patent [19]

Neidorff

[11] Patent Number: 5,554,986
[45] Date of Patent: Sep. 10, 1996

[54] DIGITAL TO ANALOG COVERTER HAVING MULTIPLE RESISTOR LADDER STAGES

[75] Inventor: Robert A. Neidorff, Bedford, N.H.

[73] Assignee: Unitrode Corporation, Billerica, Mass.

[21] Appl. No.: 237,388

[22] Filed: May 3, 1994

[51] Int. Cl.[6] .................................................. H03M 1/68
[52] U.S. Cl. .......................................... 341/145; 341/153
[58] Field of Search .................................... 341/145, 146, 341/148, 153

[56] References Cited

U.S. PATENT DOCUMENTS

| | | | |
|---|---|---|---|
| 3,710,377 | 1/1973 | Guillen et al. | 340/347 AD |
| 3,890,610 | 6/1975 | Cahen | 340/347 CC |
| 3,997,892 | 12/1976 | Susset | 341/136 |
| 4,281,319 | 7/1981 | Roberts, Jr. | 340/347 DA |
| 4,292,625 | 9/1981 | Schoeff | 340/347 DA |
| 4,293,848 | 10/1981 | Cheng et al. | 340/347 AD |
| 4,318,085 | 3/1982 | Whiteside et al. | 340/347 DA |
| 4,338,591 | 7/1982 | Tuthill | 340/347 DA |
| 4,384,277 | 5/1983 | Allgood et al. | 340/347 DA |
| 4,425,561 | 1/1984 | Whiteside et al. | 340/347 AD |
| 4,427,971 | 1/1984 | Whiteside et al. | 340/347 DA |
| 4,447,747 | 5/1984 | LaPotin | 307/529 |
| 4,468,652 | 8/1984 | Wang et al. | 340/347 DA |
| 4,491,825 | 1/1985 | Tuthill | 341/145 |
| 4,492,954 | 1/1985 | Harris et al. | 340/347 DA |
| 4,533,903 | 8/1985 | Yamada et al. | 340/347 AD |
| 4,543,560 | 9/1985 | Holloway | 340/347 DA |
| 4,547,763 | 10/1985 | Flamm | 340/347 CC |
| 4,599,599 | 7/1986 | Sekino et al. | 340/347 AD |
| 4,635,036 | 1/1987 | Yoshizawa | 340/347 AD |
| 4,635,038 | 1/1987 | Wincn | 340/347 DA |
| 4,638,303 | 1/1987 | Masuda et al. | 340/347 DA |
| 4,668,936 | 5/1987 | Newcomb et al. | 340/347 AD |
| 4,761,636 | 8/1988 | Brokaw et al. | 340/347 AD |
| 4,833,473 | 5/1989 | Dingwall | 341/154 |
| 4,843,395 | 6/1989 | Morse | 341/156 |
| 4,918,448 | 4/1990 | Hauviller et al. | 341/145 |
| 4,973,979 | 11/1990 | Ikeda | 341/154 |
| 5,014,055 | 5/1991 | Dingwall et al. | 341/159 |
| 5,070,332 | 12/1991 | Kaller et al. | 341/156 |
| 5,084,703 | 1/1992 | Kane | 341/154 |
| 5,111,205 | 5/1992 | Morlon | 341/156 |
| 5,212,482 | 5/1993 | Okuyama | 341/139 |
| 5,252,975 | 10/1993 | Yuasa et al. | 341/145 |

OTHER PUBLICATIONS

Operation Manual entitled "Model KVD–700 Kelvin–Varley Voltage Divider", dated Jan. 1992, of IET Labs, Inc. 534 Main Street, Westbury, N.Y. 11590, consisting of one cover page, pp. 1–5, p. 53 and Schematic, No. KVD–700–8000, Rev. C.

*Primary Examiner*—Marc S. Hoff
*Attorney, Agent, or Firm*—Weingarten, Schurgin, Gagnebin & Hayes

[57] ABSTRACT

A multi-stage digital to analog converter with increased speed and enhanced accuracy. Multiple resistor ladders are interconnected through switches with the first resistor ladder converting the most significant bits and successive ladders converting lesser significant bits. The resistance values of the resistors of each ladder are greater than those of the preceding ladders in order to minimize inaccuracies due to loading. A monolithic fabrication technique includes a common resistor biasing scheme to switch the voltage across parasitic capacitances associated with the resistors in each ladder in common mode, thereby increasing the converter speed.

17 Claims, 4 Drawing Sheets

DIGITAL TO ANALOG COVERTER HAVING MULTIPLE RESISTOR LADDER STAGES

FIELD OF THE INVENTION

This invention relates generally to digital to analog converters and more particularly, to a monolithic digital to analog converter having increased speed and enhanced accuracy.

BACKGROUND OF THE INVENTION

Two stage cascaded converters for converting a digital word into a corresponding analog voltage are known. The first stage includes a series string, or ladder of resistors coupled across a supply voltage for dividing the voltage into a number of incremental voltages. The first resistor ladder resolves higher order bits of the digital word and the second resistor ladder resolves lower order bits. The first resistor ladder is coupled to the second resistor ladder by a plurality of switches and buffer amplifiers. Such arrangements are shown in U.S. Pat. Nos. 4,543,560 and 3,997,892. Generally, buffer amplifiers have offset voltages associated therewith and require trimming in order to obtain satisfactory conversion accuracy.

Another type of digital to analog converter utilizes a Kelvin-Varley voltage divider in which the accuracy of the conversion is dependent on the accuracy of resistor matching. More particularly, the Kelvin-Varley divider includes a plurality of resistor ladders coupled together by a plurality of switches with each of the resistors having a resistance value precisely matched to the value of the other resistors. A portion of each resistor ladder is connected in parallel with a portion of a succeeding resistor ladder and the loading of preceding ladders is critical to obtaining a desired output voltage. Also, switch resistance is critical and must be extremely low.

SUMMARY OF THE INVENTION

In accordance with the invention, a monolithic digital to analog (D/A) converter circuit includes multiple stages for converting a digital word into a corresponding analog voltage with increased speed and enhanced accuracy. Each stage of the converter includes a resistor ladder coupled to a resistor ladder of an adjacent stage through a plurality of switches. The number of resistors comprising each resistor ladder is related to the number of bits resolved by the particular stage with the first ladder resolving higher order bits and subsequent ladders resolving lower order bits.

More particularly, a first portion of the switches interconnecting adjacent resistor ladders have first terminals coupled to the first resistor ladder and second terminals coupled to a top output node of the first stage and to a top input node of the second stage. A second portion of the switches likewise have first terminals coupled to the first resistor ladder and second terminals coupled to a bottom output node of the first stage and to a bottom input node of the second stage. A decoder is provided for receiving a digital word to be converted and controlling the switches in accordance with the bits of the digital word.

The resistors of each stage have resistance values greater than the resistors of the preceding stages in order to prevent disadvantageous loading and thus, to enhance conversion accuracy. More particularly, the accuracy of the converter is enhanced without requiring the added complexity and inaccuracies associated with the use of buffer amplifiers to isolate adjacent stages. In one embodiment, the resistors of the first stage are comprised of polycrystalline silicon and the resistors of the subsequent stages are diffusion resistors.

In accordance with a further aspect of the invention, the integrated circuit resistors of each resistor ladder are biased to a common substrate which, in turn, is biased to the top output node of the preceding stage (i.e., to the top input node of the biased stage). With this arrangement, the voltage across the parasitic capacitances associated with the integrated circuit resistors is switched in common mode, thereby increasing the speed of the converter.

BRIEF DESCRIPTION OF THE DRAWINGS

The foregoing features of this invention, as well as the invention itself, may be more fully understood from the following detailed description of the invention in which.

DESCRIPTION OF THE PREFERRED EMBODIMENT

Figure 1:
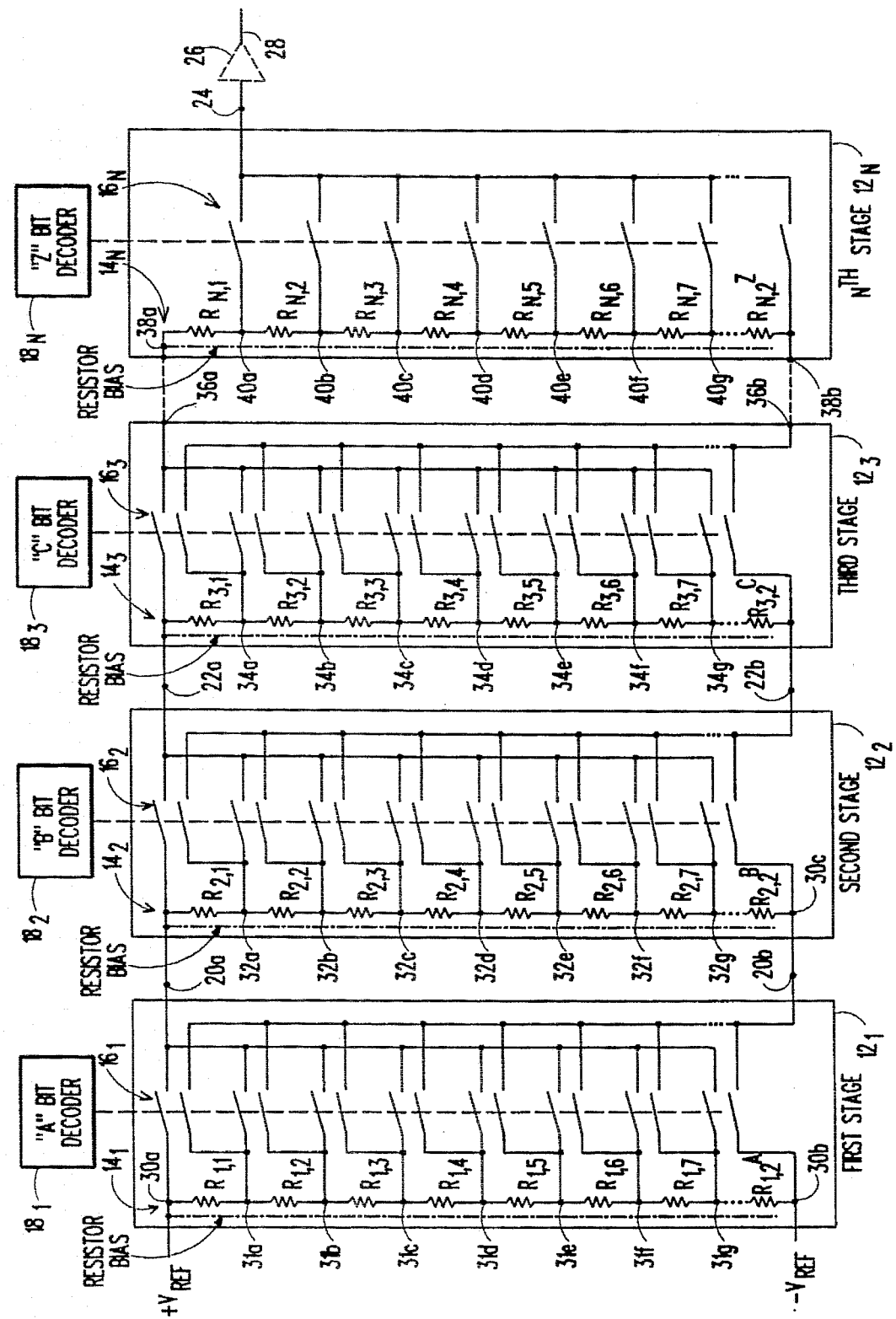
FIG. 1 is a schematic diagram of a digital to analog converter in accordance with the present invention.

Referring to FIG. 1, a digital to analog (D/A) converter is shown to include multiple stages $12_1, 12_2, \ldots 12_N$, with each stage including a resistor ladder, or divider $14_1, 14_2, \ldots 14_N$ and a plurality of switches $16_1, 16_2, \ldots 16_N$, respectively. Also associated with each stage $12_1, 12_2, \ldots 12_N$ is a decoder $18_1, 18_2, \ldots 18_N$. Each stage converts, or resolves, a predetermined number of bits of a digital word to be converted into an analog voltage, with the first stage $12_1$ resolving, "A" most significant bits, the second stage $12_2$ resolving "B" lesser significant bits, the third stage $12_3$ resolving "C" lesser significant bits, and the Nth stage $12_N$ resolving "Z" least significant bits. The number of bits resolved by each stage may or may not be the same as other stages and may be varied in accordance with a particular application. The summation of the number of bits resolved in each stage determines the number of bits of digital data conversion. For example, where the converter includes the illustrated four stages $12_1, 12_2, 12_3, 12_N$ and A=B=C=Z=3, the converter is a twelve bit converter.

Each of the resistor ladders $14_1, 14_2, \ldots, 14_N$ includes a plurality of resistors coupled in series and having the same resistance value as other resistors in the same stage. The number of resistors in each stage is related to the number of bits resolved by that stage. More particularly, the number of resistors of each stage is equal to two raised to a power equal to the number of bits to be converted in that stage. Thus, the first, second, and Nth stages $12_1, 12_2 \ldots 12_N$ include $2^A$, $2^B$ and $2^Z$ resistors, respectively. For example, where A=B=C=Z=3, each resistor divider $14_1, 14_2, \ldots, 14_N$ includes $2^3$, or eight resistors, as shown.

Adjacent ones of the resistor ladders $14_1, 14_2 \ldots, 14_N$ are interconnected by a string of switches $16_1, 16_2 \ldots, 16_{N-1}$. The number of switches of each interconnecting string $16_1, 16_2, \ldots 16_{N-1}$ is $2(2^X)$, where "X" is the number of bits resolved in the preceding one of the adjacent, interconnected stages. For example, where the converter includes the illustrated four stages $12_1$, $12_2$, $12_3$, and $12_N$, (i.e., where N=4), each of the interconnecting switch strings $16_1$, $16_2$, $16_3$ includes $2(2^3)$, or sixteen switches, as shown.

Each stage $12_1$, $12_2$, ... $12_{N-1}$ has a pair of input nodes, a pair of output nodes, and a plurality of nodes between adjacent resistors of the corresponding resistor ladder $14_1$, $14_2$, ... $14_{N-1}$. For example, the first stage $12_1$ has a input nodes 30a,b, output nodes 20a,b, and nodes 31a–g between adjacent ones of the resistors $R_{1,1}$–$R_{1,2}^A$ of the ladder $14_1$. The input nodes 30a,b of the first stage $12_1$, are coupled across a supply voltage, labelled $+V_{REF}$, $-V_{REF}$. The input nodes 20a,b, 22a,b, and 38a,b of subsequent stages $12_2$, $12_3$, and $12_N$ are provided by the output nodes of the preceding stage and, in operation, are coupled across a portion of the resistor ladder of the preceding stage in accordance with the state of the switches of the interconnecting resistor string, as will become apparent. The last, or Nth stage differs in that the output node 24 is single-ended and provides the converter output signal 28, as will be discussed.

Each of the nodes between adjacent resistors in a given stage is coupled to a pair of switches, as shown. Considering exemplary first stage $12_1$ for example, each of the resistor interconnection nodes 31a–g is coupled to first terminals of two of the plurality of switches $16_1$. The second terminal of one such switch is coupled to the top output node 20a of the first stage $12_1$ and the second terminal of the other such switch is coupled to the bottom output node 20b of the first stage $12_1$, as shown. More particularly, a first portion of the switches $16_1$ have first terminals coupled to the first resistor ladder $14_1$ and second terminals coupled to the top output node 20a of the first stage $12_1$. A second portion of the plurality of switches $16_1$ have first terminals coupled to the first resistor ladder $14_1$ and second terminals coupled to the bottom output node 20b. Subsequent stages $12_2$, $12_3$ are similarly arranged. The last, or Nth stage differs in that each resistor interconnection node 40a–g is coupled to only a single switch which is further coupled to the output node 24 of the converter. An optional output buffer amplifier 26 receives the analog voltage from the converter output node 24 to provide an analog output voltage on output signal line 28.

Each of the resistors $R_{1,1}$–$R_{1,2}^A$ in the first resistor ladder $14_1$ has a relatively low resistance value. The resistance values of resistors in subsequent stages $12_2$, $12_3$, ... $12_N$ are higher than those of the first resistor ladder $14_1$. Preferably, the resistors of each subsequent ladder have a higher resistance value than the resistors of the just preceding resistor ladder. This arrangement prevents undesirable loading on the preceding stages, such as may deteriorate the accuracy of the converter. In one embodiment, the resistors of the first stage $12_1$ are comprised of polycrystalline silicon and the resistors of subsequent stages $12_2$, $12_3$, ... $12_N$ are diffusion resistors, providing a higher resistance value than polycrystalline silicon resistors for the same size resistor, as will be discussed below in conjunction with FIGS. 2 and 3.

Preferably, each of the switches of switch strings $16_1$, $16_2$, ... $16_N$ has a lower resistance than the resistors in the subsequent ladder but may have a resistance comparable to that of the resistors in the preceding ladder. In this way, conversion inaccuracies due to voltage drops across the switches are avoided. For example, it is advantageous for the switches of string $16_1$ to have a resistance value lower than the resistors $R_{2,1}$–$R_{2,2}^B$ of the second stage $12_2$.

Each of the resistors of a particular stage is biased to a common substrate which in turn is biased to the voltage at the top output node of the preceding stage (i.e., the top input node of the particular stage). For example, each of the resistors $R_{2,1}$–$R_{2,2}^B$ of the resistor ladder $14_2$ of the second stage $12_2$ is biased to a substrate which in turn is biased to the voltage at the top output node 20a of the preceding, or first stage $12_1$. Likewise, each of the resistors $R_{3,1}$–$R_{3,2}$ of the resistor divider $14_3$ of the third stage $12_3$ is biased to a common substrate which in turn is biased to the voltage at the top output node 22a of the preceding, or second stage $12_2$. With this arrangement, the voltage across parasitic capacitances associated with each of the integrated circuit resistors of the converter is switched in common mode, thereby increasing the speed of conversion otherwise reduced by the effect of setting times associated with distributed RC time constants.

Figure 2:
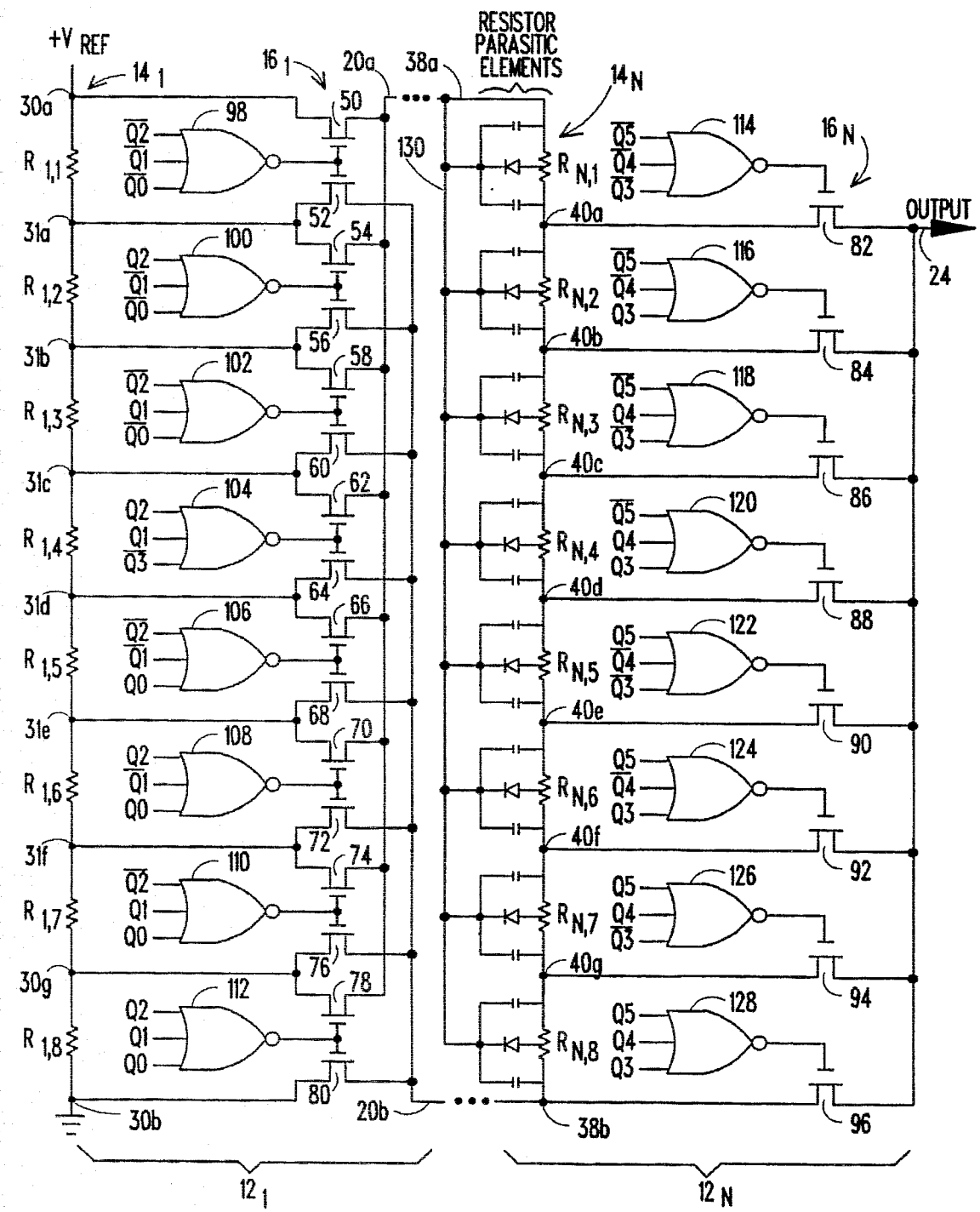
FIG. 2 is a more detailed schematic diagram of a portion of the digital to analog converter of FIG. 1.

Referring to FIG. 2, a schematic of the D/A converter of FIG. 1 is shown to include only the first and last stages $12_1$, $12_N$ for simplicity. Each of the switches 50–80 and 82–96 of switch strings $16_1$, $16_N$, respectively, are field effect transistors (FETs); however, other types of integrated circuit switches, such as bipolar transistors, may alternatively be used. The switches are controlled in pairs, with adjacent switches being commonly controlled by the output of a corresponding NOR gate 98–128, as shown. At any given time, only one pair of adjacent switches in each ladder is closed while the remaining switch pairs are open.

The decoders $18_1$, $18_N$ (FIG. 1) associated with the stages $12_1$, $12_N$ comprise the NOR gates 98–112 and 114–128, respectively. Input signals corresponding to the bits to be resolved in a given stage are coupled to the NOR gates, as shown. For example, where the converter includes only two stages $12_1$, $12_N$, with each stage resolving three bits of data, three digital signals $Q_0$–$Q_2$ are coupled to each of the NOR gates 98–112 of the first stage $12_1$ and three digital signals Q3–Q5 are coupled to each of the NOR gates 114–128 of the second stage $12_N$. The bits Q0–Q2 resolved by the first stage $12_1$ correspond to the greatest significant bits of the digital word to be converted and bits Q3–Q5 resolved by the second stage $12_N$ correspond to the least significant bits of the digital word. Inversion circuitry (not shown) inverts the digital bits Q0–Q5 of the digital word to provide inverted bits $\overline{Q0}$–$\overline{Q5}$ to the NOR gates, as shown.

To illustrate the operation of the converter, consider the case where the digital word to be converted is 100010 and the reference voltage $+V_{REF}$ is +2.5V (i.e., $-V_{REF}$ is at ground). Thus, the three greatest significant bits provide digital signals as follows: Q0=1, Q1=0, and Q2=0. With this arrangement, the output of NOR gate 104 is at a logic high state causing the corresponding switches 62, 64 to close and the outputs of all of the other NOR gates of the first stage $12_1$ are in a logic low state causing the remaining switches of the first stage $12_1$ to remain open. Thus, the top output node 20a of the first stage $12_1$ is coupled to resistor interconnection node 31c through closed switch 62 (i.e., such node 31c being at a voltage of 2.5V*⅝=1.5625V) and the bottom output node 20b is coupled to resistor interconnection node 31d through closed switch 64 (i.e., such node 31d being at a voltage of 2.5V*⅘=1.25V). Thus, the top input node 38a of the second stage $12_N$ is at 1.5625 volts and the bottom input node 38b of the second stage $12_N$ is at 1.25 volts so that the resistor divider $14_N$ of the subsequent stage $12_N$ divides the 0.3125V thereacross into eight equal incremental voltages.

The lesser significant bits provide digital signals to the NOR gates 114–128 of the second stage $12_N$ as follows: Q3=0, Q4=1, and Q5=0. With this arrangement, the only NOR gate of the second stage gates 114–128 having a logic high output is NOR gate 124, thereby causing switch 92 to be closed. Closure of switch 92 causes the voltage at resistor interconnection node 40f (i.e., equal to 1.25+(0.3125V,⅝)= 1.328125V) to be coupled to the output node 24 to provide the analog output voltage.

The operation of the converter is advantageously monotonic (i.e., the output signal 24 continuously increases as the digital word increases). As should be apparent from the above illustration of the converter operation, the maximum voltage swing at the output nodes 20a, b of the first stage 12$_1$ having a +/–$V_{REF}$ of 2.5 volts coupled thereacross is 2.1875V. That is, the top output node 20a can swing between 2.5V and 0.3125V, whereas the bottom output node 20b can swing between 2.1875V and ground. Without the resistor biasing scheme herein provided, this voltage swing would disadvantageously reduce the speed of the converter due the effect of such voltage swing on parasitic capacitances inherent in the monolithic construction of the converter resistors. More particularly, each of the integrated circuit resistors of the converter has parasitic capacitance associated therewith, as represented by the two capacitors associated with each of the resistors $R_{N,1}$–$R_{N,8}$ of the stage 12$_N$ and labelled resistor parasitic elements. The parasitic diode associated with each resistor is characteristic of diffusion resistors, as described below.

Figure 3:
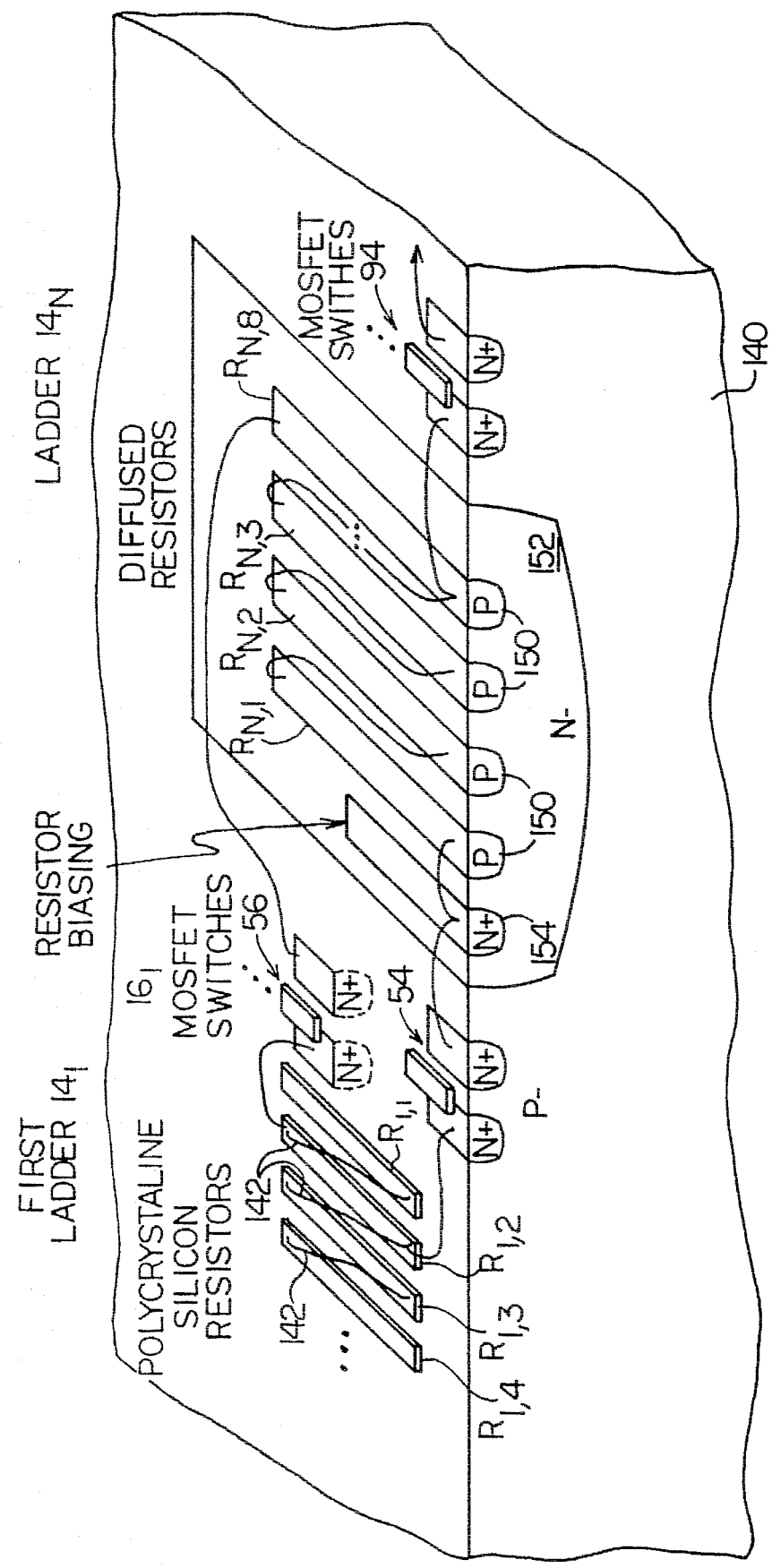
FIG. 3 is a cross-sectional view of a portion of the monolithic digital to analog converter of FIG. 2.

In order to increase the speed of the converter, each of the resistors of a given stage is biased to a common substrate, as represented by biasing path 130 and discussed in conjunction with FIG. 3. Suffice it here to say that with this arrangement, the parasitic capacitances are switched in common mode by a low impedance, thereby minimizing the effect of distributed RC time constants on the settling time of the converter. More particularly, the common resistor biasing scheme avoids conversion speed reduction caused by charging and discharging the parasitic capacitances every time a bit of the digital word changes. It is noted that while the resistors of the first stage have parasitic capacitance associated therewith (not shown), common biasing of the resistors of the first stage 12$_1$ is unnecessary since the resistor divider 14$_1$ of the first stage 12$_1$ is coupled across a constant supply voltage. Moreover, the polycrystalline silicon resistors of the first resistor divider 14$_1$, fabricated in the same manner as MOSFET gate electrodes, have very low parasitic capacitance.

Referring to FIG. 3, a cross-sectional view of a portion of the integrated circuit converter of FIG. 2 is shown. The IC includes a P- substrate 140 over which the polycrystalline silicon resistors $R_{1,1}$–$R_{1,8}$ of the resistor ladder 14$_1$ of the first stage 12$_1$ are formed. Only four $R_{1,1}$–$R_{1,4}$ of the eight polycrystalline silicon resistors $R_{1,1}$–$R_{1,8}$ are shown for clarity. Polycrystalline silicon is advantageous for use in fabricating the resistors of the first stage 12$_1$ since such resistors have low bulk resistivity and thus, provide accurate low resistance devices. Conductors 142 interconnect the resistors of the first ladder 14$_1$ in series (as shown for exemplary resistors $R_{1,1}$–$R_{1,4}$) and further interconnect each of the resistors to the corresponding switches (as shown for exemplary resistor $R_{1,2}$ coupled to FET switches 54, 56).

The resistors of the subsequent stages 12$_2$–12$_N$ are diffusion resistors which are smaller in size than polycrystalline silicon resistors for the same resistance value. As mentioned, the resistors of each stage have resistance values greater than the resistors of the preceding stage, rendering the smaller size of the diffusion resistors particularly advantageous. That is, use of diffusion resistors permits the fabrication of larger resistance devices without requiring significant die area.

Diffusion resistors have, in addition to a parasitic capacitance associated therewith, an inherent diode, as shown in FIG. 2 for resistors $R_{N,1}$–$R_{N,8}$. The present biasing scheme utilizes the inherent diode associated with the diffusion resistors to commonly bias the resistors of each stage to the potential of the top input node of such stage. More particularly, each of the diffusion resistors comprises a P-type doped region of silicon 150 disposed in an N-well 152 with like regions 150 associated with the other resistors of the same ladder. For example, each of the illustrated P-type regions 150 provides one of the resistors of the second and last stage 12$_N$ in the illustrative embodiment of FIG. 2. The inherent diode is disposed between the P-type regions 150 and the adjacent N-well 152. Also shown is an exemplary one 94 of the transistor switches 82–96 coupled between the resistor ladder 14$_N$ of the Nth stage 12$_N$ and the output node 24 (FIG. 2).

The common biasing described above is achieved by providing an N+ contact 154 in the N-well 152, as shown. The N+ contact 154 is connected to FET 54 for biasing of the contact 154 to the potential of the top output node 20a of the preceding stage 12$_1$ (FIG. 2). The entire N-well 152 is thus biased to the potential of the top output node 20a (i.e., and interconnected input node 38), thereby causing the parasitic capacitances between the P-type regions 150 and the surrounding N-well 152 to be switched in common mode so that the effect of distributed RC time constants on the setting time of the converter is minimized.

The presence of the inherent diode associated with each of the diffusion resistors results in a preferred bias polarity. Specifically, the N-well 152 is connected to the cathode of the inherent diodes of the diffusion resistors and is preferably connected to the higher potential to reverse bias the diodes. This arrangement minimizes junction current errors and lowers the parasitic capacitances since junction capacitors are voltage dependent and a reverse bias lowers the effective capacitance.

It is noted that although an N-well MOS process is shown, the converter circuit described herein may alternatively be implemented with a P-well or multiple well process. The switches comprising switch ladders 16$_1$–16$_N$ may be PMOSFETs, NMOSFETs, or pairs of PMOSFETs and NMOSFETs. In the embodiment of FIGS. 2 and 3, each of the switches 50–96 (FIG. 2) is an NMOS transistor. NMOS transistors are suitable for use in the illustrative embodiment since the reference voltage +$V_{REF}$ is +2.5V and the logic high output voltage of gates 98–128 is +5.0V.

Figure 4:
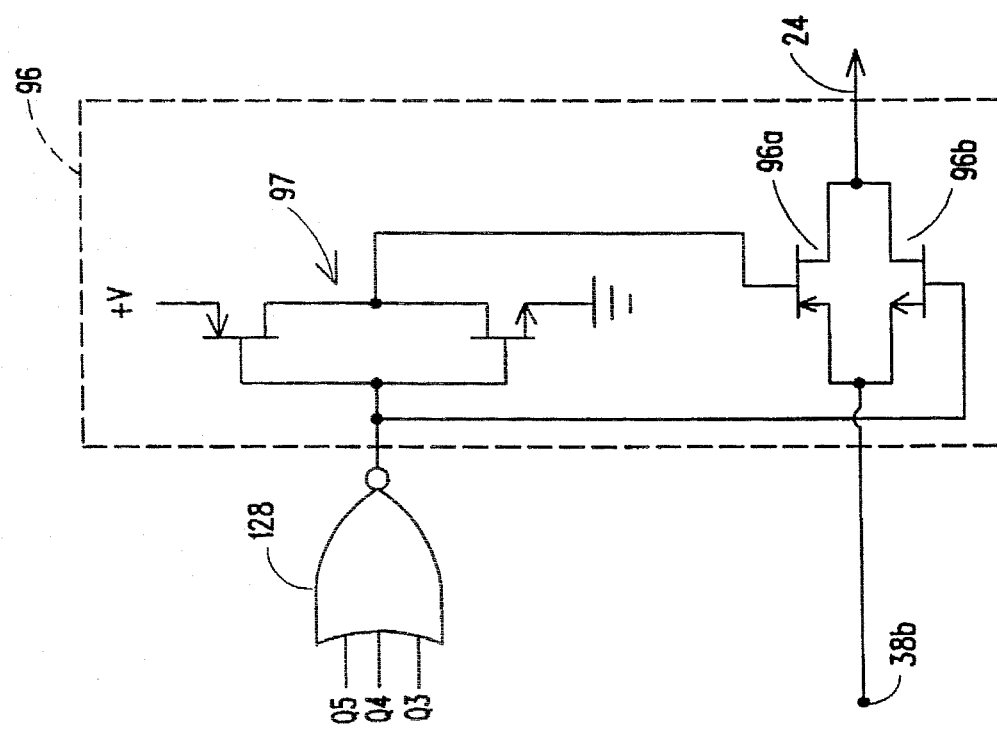
FIG. 4 is a schematic diagram of a portion of the digital to analog converter of FIG. 2 showing an alternate switch embodiment.

Referring to FIG. 4, exemplary switch 96 of FIG. 2 is shown to comprise an NMOSFET 96b and a PMOSFET 96a. Utilizing pairs of PMOS and NMOS FETs coupled in parallel for each of the switches 50–96 is advantageous since such an arrangement is capable of switching both high and low voltages (i.e., with the NMOSFET 96b switching low voltages and the PMOSFET 96a switching high voltages). An inverter 97 is provided to invert the NMOS gate signal for driving the PMOS FET, as shown.

Having described preferred embodiments of the invention, it will be apparent to one of skill in the art that other embodiments incorporating their concepts may be used. Accordingly, the invention should be limited only by the spirit and scope of the appended claims.

I claim:

1. A digital to analog converter comprising:

a first resistor ladder comprising a first plurality of resistors coupled in series, said first resistor ladder being coupled across a supply voltage;

a second resistor ladder comprising a second plurality of resistors coupled in series, wherein each of said second plurality of resistors has a higher resistance value than each of said first plurality of resistors;

a plurality of switches coupled between said first resistor ladder and said second resistor ladder; and a decoder responsive to a digital input signal for controlling said plurality of switches so as to provide an analog output signal across a portion of said second resistor ladder having a value corresponding to said digital input signal.

2. The digital to analog converter recited in claim 1 wherein a first portion of said plurality of switches has first terminals coupled to said first resistor ladder and second terminals coupled to a top one of said second plurality of resistors of said second resistor ladder and wherein a second portion of said plurality of switches has first terminals coupled to said first resistor ladder and second terminals coupled to a bottom one of said second plurality of resistors of said second resistor ladder.

3. The digital to analog converter recited in claim 1 wherein said plurality of switches are FETs.

4. The digital to analog converter recited in claim 1 wherein each resistor of said first resistor ladder is comprised of polycrystalline silicon and each resistor of said second resistor ladder is a diffusion resistor.

5. A digital to analog converter comprising:

a first resistor ladder having a top node and a bottom node and comprising a first plurality of resistors coupled in series, said top and bottom nodes being coupled across a supply voltage;

a second resistor ladder having a top node and a bottom node and comprising a second plurality of resistors coupled in series, wherein each of said second plurality of resistors has a higher resistance value than each of said first plurality of resistors;

a plurality of switches coupled between said first resistor ladder and said second resistor ladder, wherein a first portion of said plurality of switches has first terminals coupled to said first resistor ladder and second terminals coupled to said top node of said second resistor ladder and wherein a second portion of said plurality of switches has first terminals coupled to said first resistor ladder and second terminals coupled to said bottom node of said second resistor ladder such that each junction between two adjacent ones of said first plurality of resistors of said first resistor ladder is coupled to one of said first terminals of said first portion of said plurality of switches and to one of said first terminals of said second portion of said plurality of switches; and a decoder responsive to a digital input signal for controlling said plurality of switches so as to provide an analog output signal across a portion of said second resistor ladder having a value corresponding to said digital input signal.

6. The digital to analog converter recited in claim 5 wherein said plurality of switches are FETs.

7. The digital to analog converter recited in claim 5 wherein each of said first plurality of resistors is comprised of polycrystalline silicon and each of said second plurality of resistors is a diffusion resistor.

8. A monolithic digital to analog converter comprising:

a resistor ladder comprising a plurality of integrated circuit resistors coupled in series, wherein each of said resistors is biased to a common substrate.

9. The digital to analog converter recited in claim 8 further comprising a preceding resistor ladder comprising a second plurality of resistors coupled in series, said preceding resistor ladder being coupled across a supply voltage, and a plurality of switches coupled between said resistor ladder and said preceding resistor ladder.

10. The digital to analog converter recited in claim 9 wherein each resistor of said resistor ladder is a diffusion resistor and each resistor of said preceding resistor ladder is comprised of polycrystalline silicon.

11. A integrated circuit digital to analog converter comprising:

a first resistor ladder comprising a first plurality of resistors coupled in series and comprising polycrystalline silicon, said first resistor ladder being coupled across a supply voltage;

a second resistor ladder comprising a second plurality of resistors coupled in series and having a pair of input nodes, wherein each of said second plurality of resistors is a diffusion resistor having a greater resistance value than each of said first plurality of resistors;

a plurality of switches coupled between said first resistor ladder and said pair of input nodes of said second resistor ladder; and a decoder responsive to a digital input for controlling said plurality of switches so as to provide an analog output signal across a portion of said second resistor ladder having a value corresponding to said digital input signal.

12. The converter recited in claim 11 wherein each of said diffusion resistors comprises a doped silicon region disposed in a common well, wherein said well is biased to the potential of one of said input nodes of said second resistor ladder.

13. The converter recited in claim 11 wherein each of said plurality of switches comprises a FET.

14. A digital to analog converter comprising:

a decoder responsive to a digital word comprising a plurality of bits for providing a switch control signal; and a plurality of stages, each stage having a pair of input nodes and a pair of output nodes and converting a corresponding plurality of said bits of said digital word into an analog voltage, wherein each one of said plurality of stages comprises:

(a) a resistor ladder coupled across said pair of input nodes; and (b) a plurality of switches coupled between said resistor ladder and said pair of output nodes and controlled by said switch control signal, wherein said pair of output nodes of at least one of said plurality of stages is coupled to said pair of input nodes of a succeeding one of said plurality of stages and said pair of output nodes of at least one of said plurality of stages is coupled to an output terminal of said converter, wherein each resistor of said resistor ladder of a succeeding stage has a higher resistance value than each resistor of said resistor ladder of a preceding stage.

15. A digital to analog converter comprising:

a first resistor ladder having a top node and a bottom node and comprising a first plurality of resistors coupled in series, said top and bottom nodes being coupled across a supply;

a second resistor ladder having a top node and a bottom node and comprising a second plurality of integrated circuit resistors, each one coupled to a common substrate, wherein each of said second plurality of resistors has a higher resistance value than each of said first plurality of resistors;

a plurality of switches coupled between said first resistor ladder and said second resistor ladder, a first portion of said plurality of switches having first terminals coupled to said first resistor ladder and second terminals coupled to said top node of said second resistor ladder and a second portion of said plurality of switches having first terminals coupled to said first resistor ladder and second terminals coupled to said bottom node of said second resistor ladder, wherein said common substrate is coupled to said top node of said first resistor ladder; and a decoder responsive to a digital input signal for controlling said plurality of switches so as to provide an analog output signal across a portion of said second resistor ladder having a value corresponding to said digital input signal.

16. The digital to analog converter recited in claim 15 wherein each of said plurality of switches comprises an NMOS FET.

17. The digital to analog converter recited in claim 15 wherein each of said plurality of switches comprises a PMOS FET and an NMOS FET coupled in parallel.

\* \* \* \* \*

UNITED STATES PATENT AND TRADEMARK OFFICE
CERTIFICATE OF CORRECTION

PATENT NO. : 5,554,986
DATED : September 10, 1996
INVENTOR(S) : Robert A. Neidorff It is certified that error appears in the above-identified patent and that said Letters Patent is hereby corrected as shown below:

Column 4, line 32, "Qo-Qz", should read --Q0-Q2--.

Column 7, claim 8, lines 61-64, "A monolithic to analog converter comprising:
a resistor ladder comprising a plurality of integrated
    circuit resistors coupled in series, wherein each of said
    resistors is biased to a common substrate.", should read
--A monolithic digital to analog converter comprising:
    a first resistor ladder comprising a plurality of integrated circuit resistors coupled in series, wherein each of said resistors is coupled to a common substrate, said first resistor ladder being coupled across a supply voltage;
    a second resistor ladder comprising a second plurality of resistors coupled in series, wherein each of said second plurality of resistors has a higher resistance value than each of said first plurality of resistors;
    a plurality of switches coupled between said first resistor ladder and said second resistor ladder; and
    a decoder responsive to a digital input for controlling said plurality of switches so as to provide an analog output signal across a portion of said second resistor ladder having a value corresponding to said digital input signal.--.

Signed and Sealed this

Second Day of February, 1999

Attest:

Attesting Officer

*Acting Commissioner of Patents and Trademarks*